(12) United States Patent
Kamula

(10) Patent No.: US 9,022,101 B2
(45) Date of Patent: May 5, 2015

(54) ARRANGEMENT IN A LIQUID COOLER

(75) Inventor: Petri Kamula, Laihia (FI)

(73) Assignee: Vacon Oyj, Vaasa (FI)

( * ) Notice: Subject to any disclaimer, the term of this patent is extended or adjusted under 35 U.S.C. 154(b) by 933 days.

(21) Appl. No.: 12/949,386

(22) Filed: Nov. 18, 2010

(65) Prior Publication Data

US 2011/0146962 A1   Jun. 23, 2011

(30) Foreign Application Priority Data

Dec. 18, 2009  (FI) .................................. 20096363

(51) Int. Cl.
*F28F 9/02* (2006.01)
*H05K 7/20* (2006.01)

(52) U.S. Cl.
CPC ................................. *H05K 7/20927* (2013.01)

(58) Field of Classification Search
CPC ............................... F28F 9/0273; F28F 9/026
USPC ................. 165/173, 174, 175, 176, 153, 110; 62/503
See application file for complete search history.

(56) References Cited

U.S. PATENT DOCUMENTS

| | | | | |
|---|---|---|---|---|
| 3,063,682 A | * | 11/1962 | Greene et al. .................. | 165/110 |
| 4,303,124 A | * | 12/1981 | Hessari .......................... | 165/167 |
| 5,178,209 A | * | 1/1993 | Aoki et al. ..................... | 165/110 |
| 5,636,684 A | | 6/1997 | Teytu et al. | |
| 6,005,772 A | * | 12/1999 | Terao et al. .................... | 361/699 |
| 6,031,751 A | | 2/2000 | Janko | |
| 6,032,726 A | | 3/2000 | Wright et al. | |
| 7,320,359 B2 | | 1/2008 | Miettinen et al. | |
| 7,727,493 B2 | * | 6/2010 | Filippi et al. .................. | 422/200 |
| 2002/0174978 A1 | * | 11/2002 | Beddome et al. ............. | 165/174 |

(Continued)

FOREIGN PATENT DOCUMENTS

| | | |
|---|---|---|
| DE | 10 2006 057 796 A1 | 6/2007 |
| EP | 0 234 021 A1 | 9/1987 |

(Continued)

*Primary Examiner* — Tho V Duong

(74) *Attorney, Agent, or Firm* — Birch, Stewart, Kolasch & Birch, LLP

(57) ABSTRACT

Arrangement for circulating liquid in a liquid cooler (11) intended particularly for power electronics appliances, inside which cooler at least two longitudinal main ducts (22, 23) are arranged and transverse ducts (21) arranged between them and connecting them, and in which cooler at least one of the longitudinal ducts is an input duct (22), into which liquid from coming from outside is led via an input joint (12) and one is an output duct (23), from where the liquid is led out via the output joint (13), inside which output duct a tubular additional part (41) having an open end at least on the side of the output joint is installed, and which additional part is arranged detached from the output duct such that a gap remains between the outer surface of the additional part and the inner surface of the output duct for enabling a liquid flow in the output duct outside the additional part, and in which arrangement a first aperture or first apertures (P, N, P2) are arranged in the part of the additional part on the output joint side and/or in the output joint and/or between them for enabling a first path of passage for a part of the nominal total flow to the output joint, and a second aperture or second apertures (T, P1) are arranged in the part of the additional part that is farther from the output joint or between the additional part and the output duct for enabling a second path of passage for the remaining part of the total flow into the additional part and via it onwards to the output joint.

20 Claims, 4 Drawing Sheets

(56) References Cited

U.S. PATENT DOCUMENTS

2008/0093051 A1*  4/2008  Rios et al. .................... 165/61
2009/0173482 A1*  7/2009  Beamer et al. ............... 165/173

FOREIGN PATENT DOCUMENTS

| EP | 0 810 657 A2 | 3/1997 |
|----|--------------|--------|
| EP | 2 242 100 A1 | 10/2010 |

* cited by examiner

ARRANGEMENT IN A LIQUID COOLER

FIELD OF TECHNOLOGY

The object of this invention is a cooler that uses a liquid as a medium of heat transfer.

PRIOR ART

The general development trend of power electronics appliances, such as frequency converters, is a continuous increase in power density, i.e. the performance to be obtained from the appliance per unit of volume. The processing of power inside the appliances causes dissipation power and heating, which are generally proportional to the output power. To prevent overheating of the power components, the appliances require cooling, which must be more effective the higher the power density of the appliance is.

The most common cooling method for power electronics appliances is air cooling, wherein cool air is blown, e.g. by means of a fan, into a cooler onto which the power component is fixed. The power of air cooling is, however, limited, for which reason liquid cooling is often used when the power density increases sufficiently. This is because the specific temperature capacity, i.e. the ability to store heat per unit of mass, and more particularly per unit of volume, of a liquid, such as water is multifold when compared to air.

Figure 1:
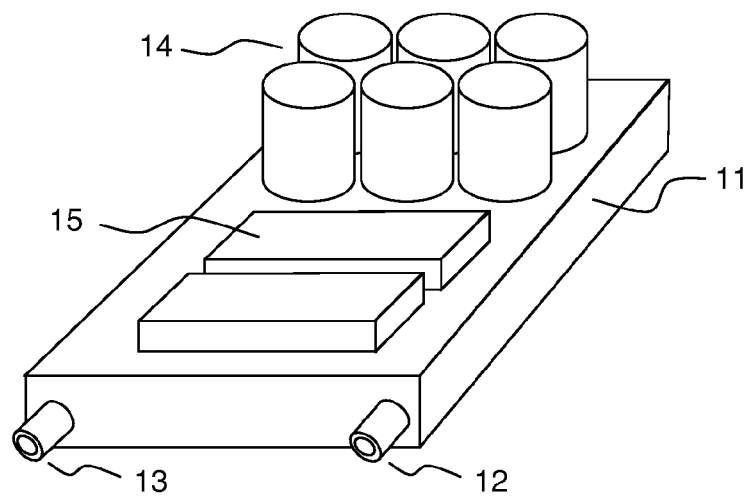

The placement of the main components of liquid-cooled power electronics appliances on the cooler can be e.g. according to FIG. 1. In it the power semiconductor modules and power capacitors are fixed to a cooler of rectangular shape, inside which cooler two longitudinal main ducts that travel in its side edges for almost the whole length of the cooler are arranged, and a number of transverse ducts (side ducts) in the transverse direction arranged between the longitudinal ducts for circulating the liquid as close as possible to the contact surface of the main components and of the cooler. The cooler is normally placed in a vertical attitude for arranging the liquid circulation of the external connections 12, 13 to be as low as possible, in which case any liquid leak in the connectors or in the external piping will not flow onto the electronics components.

Figure 2:
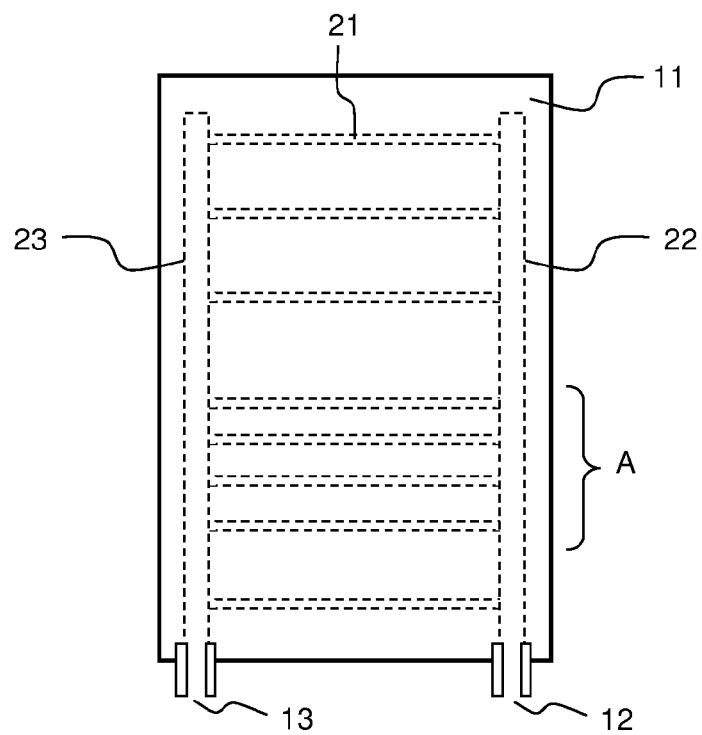

An example of the internal ducting of the cooler is presented in FIG. 2, wherein thinner transverse ducts 21 are arranged between the spacious main ducts 22, 23 connected to the external liquid circulation, via which transverse ducts the dissipation power actually transfers into the liquid, This type of cooler arrangement has become known from patent publications U.S. Pat. No. 6,032,726 and U.S. Pat. No. 7,320,359, among others.

The proper operation of the type of liquid cooler described above requires that a liquid flow of roughly the same magnitude circulates via all the transverse ducts. Venting of the cooler, i.e. removing air from the cooler, is particularly important because a possible stationary air bubble in a transverse duct completely prevents the flowing of the liquid and therefore also the transfer of heat into the flowing liquid.

The liquid cooling implemented by means of the ducting arrangement of the type of FIG. 2 functions well when the amount of liquid supplied to the cooler from outside is sufficient. In practical conditions the amount of liquid can sometimes, however, remain too small, in which case it is possible that the liquid circulates only via the lowermost transverse ducts, i.e. those situated closest to the external joints, and that air remains inside the uppermost ducts. The cooling power of these types of power components located at the point of ducts that are empty of liquid is, of course, less than intended, which in the worst possible case can result in the overheating and damaging of a component.

SUMMARY OF THE INVENTION

The aim of the current invention is to achieve a new type of arrangement that eliminates the drawbacks of prior art and improves the liquid circulation of e.g. a cooler of the type of FIG. 2 by producing a liquid flow that is as uniform as possible in the internal liquid ducts of the cooler, more particularly with low flow rates. This aim is achieved with the arrangement according to the invention, which is characterized by what is disclosed in the characterization part of the independent claim. Other preferred embodiments of the invention are the objects of the dependent claims.

According to the invention, a tubular additional part is installed into the main duct via which the liquid leaves the cooler (output duct), as a result of which the outgoing liquid is led to pass along essentially two routes such that the first route passes via the bottom part (nearest to the external joint) of the output duct and the second route passes via the top part of the output duct.

According to the invention the liquid flows are arranged such that only a part, preferably approx. 50%, of the total flow fits to pass via the first route.

According to the invention the first route of the liquid flow is implemented by means of first apertures, which apertures can be holes situated near the bottom end of the additional part or in the output joint, slots located in the ends of these parts or a gap remaining between these parts. Correspondingly, the second route of the liquid flow is implemented by means of second apertures, which apertures can be holes situated near the top end of the additional part, slots located in its top end, or a gap remaining between the top end of the additional part and the top end of the output duct. An advantageous arrangement can be implemented e.g. such that outgoing liquid is led in its entirety into the additional part fixed to the output joint and the aforementioned first route passes via the holes P bored in the additional part, which holes are disposed with respect to the longitudinal axis of the additional part on the same level between the output connector and the lowermost transverse duct, and the aforementioned second route is implemented such that the additional part is shorter than the main duct to the extent that free liquid flow into the additional part via the top end is possible. For the sake of clarity, this preferred embodiment is used as an example in the detailed description describing the invention.

The additional part is fixed to the cooler, to the connector of the output duct or to some other joint in some reliable way, e.g. with a threaded joint or by gluing. The shape of the additional part and of the holes is preferably round, but other types of shapes, e.g. polygon, are possible within the scope of the same inventive concept, as a person skilled in the art will understand well.

What is essential for implementing the flow volume of the first route according to the invention is the combined surface area of the first apertures, which must be smaller than the inner cross-sectional area of the additional part, e.g. in the range of 30-70% of it. What is also essential is that the cross-sectional area remaining between the outer surface of the additional part and the inner surface of the main duct is sufficient, preferably at least as great as the inner cross-sectional area of the additional part, to enable a flow that is as free as possible from the transverse ducts into the apertures located near the ends of the additional part.

According to one preferred embodiment of the invention, the combined surface area of the apertures belonging to the first route is approx. one-half of the inner surface area of the additional part, in which case the liquid flow coming via the transverse ducts divides at normal flow rates such that approx. one-half of the liquid flows into the additional part via the first apertures and the remainder via the second apertures. This has an advantageous effect on the even division between the transverse ducts of the liquid flows because without the additional part the flow route is shorter than it and therefore the more unobstructed the closer to the external connections the transverse duct is located. A flow between the transverse ducts that is as uniform as possible is an advantage from the viewpoint of the intended operation of the cooler.

The arrangement according to the invention has a particularly large positive effect with low flow rates. This is a result of the surface area of the first apertures, which surface area forms a flow resistance that allows through it only a part of the nominal total flow rate. For example, if the surface area is 50% of the whole inner cross-sectional area of the additional part and the total flow is slightly over 50% of the nominal flow rate, almost all the flow travels via the first apertures and only a small surplus via the second apertures from the top end of the additional part. This small flow via the top end, however, causes all the transverse ducts to fill with liquid and the cooler to vent. That being the case, cooling is considerably more effective than without the additional part according to the invention, when the transverse ducts of the top part of the cooler might remain full of air.

By means of the invention the operation of a cooler based on a liquid circulation becomes more efficient both at a full flow rate and more particularly at flow rates smaller than the nominal, which improves the cooling and via that the reliability of the whole apparatus. The additional part can be manufactured from generally available, thin, e.g. having a wall thickness of 1 mm and an outer diameter of 15 mm, metal pipe, so that it is easy to manufacture and inexpensive in costs.

SHORT DESCRIPTION OF THE DRAWINGS

In the following, the invention will be described in more detail by the aid of an embodiment with reference to the attached drawings, wherein FIG. 1 presents a liquid cooler and some power components installed onto it.

Figure 3:
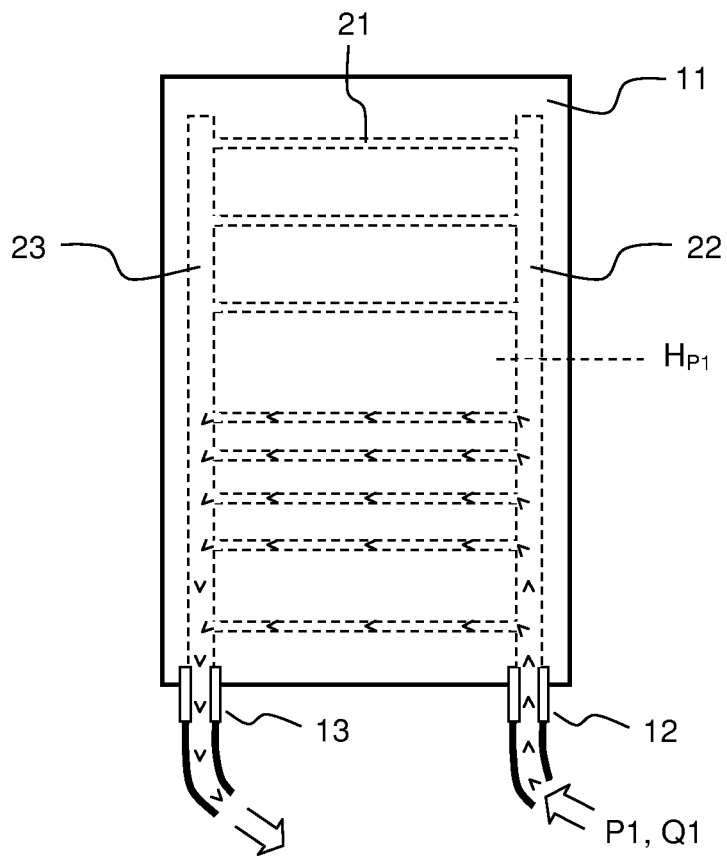
Figure 4:
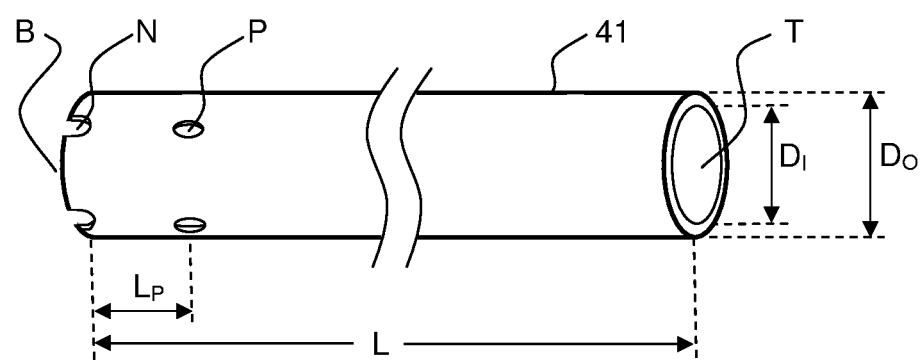
Figure 5A:
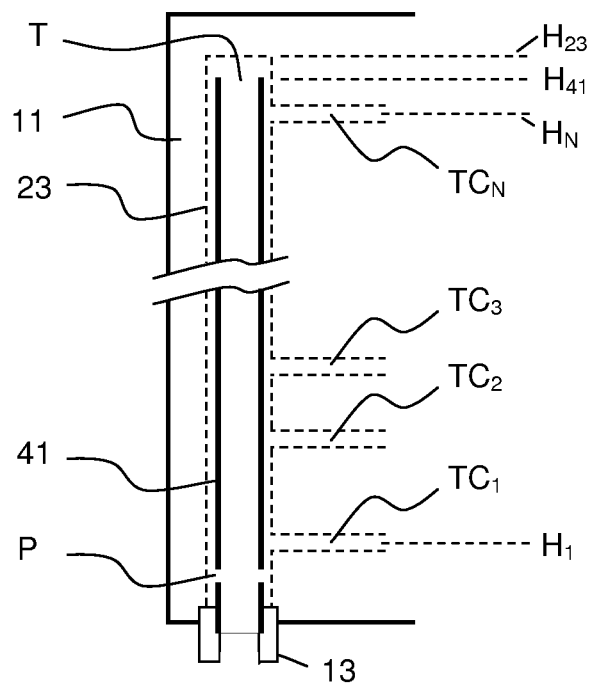
Figure 5B:
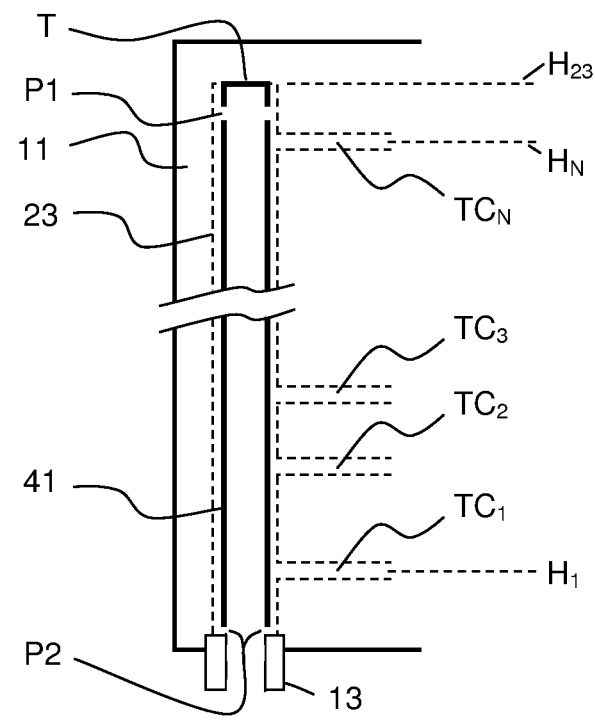
Figure 6:
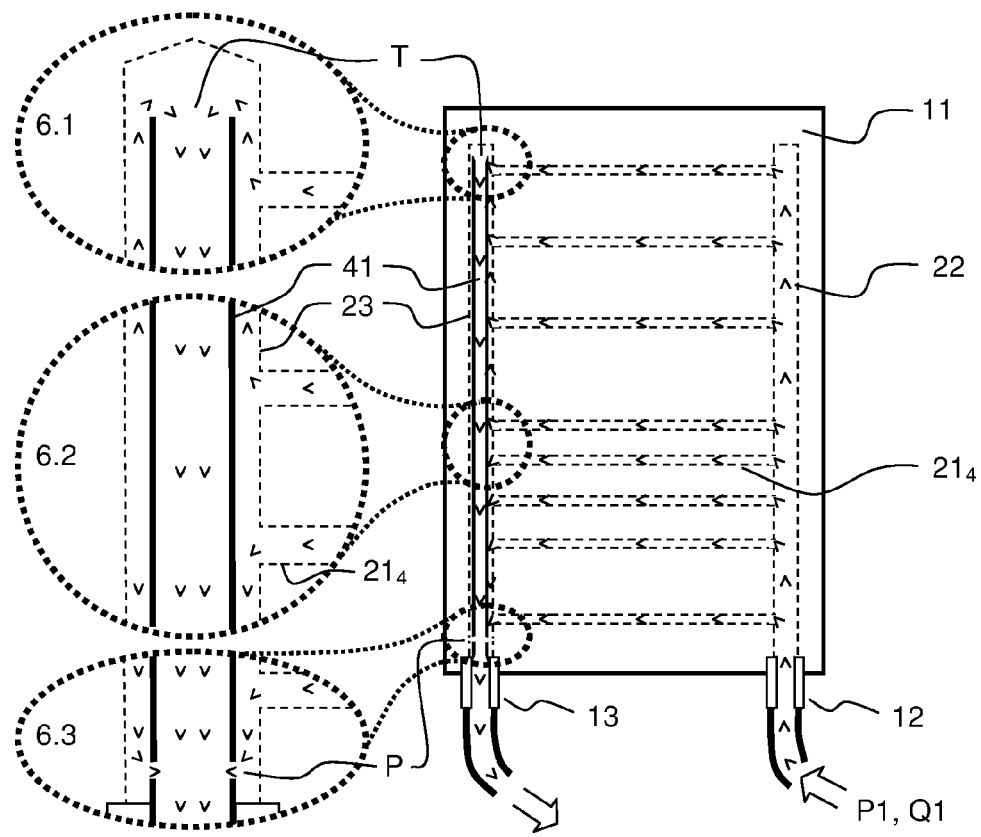

FIG. 2 presents the internal ducting of a liquid cooler,

FIG. 3 presents the liquid circulation with a low flow in a liquid cooler according to prior art, FIG. 4 presents an additional part according to the invention, FIG. 5A presents one method of disposing the additional part according to the invention in a liquid cooler, FIG. 5B presents a second method of disposing the additional part according to the invention in a liquid cooler, and FIG. 6 presents the liquid circulation in a cooler provided with an additional part according to the invention.

DETAILED DESCRIPTION OF THE INVENTION

FIG. 1 presents the typical placement according to the invention of power components on a liquid cooler. For the sake of clarity, the figure is simplified and only the cooler and the essential parts from the viewpoint of the current invention are presented in it, but not e.g. the connection parts or fixing parts of components. In the figure, the external liquid circulation is connected to the cooler 11 via the input connector 12 and the output connector 13. The power components that require cooling, such as capacitors 14 and power semiconductor modules 15, are fixed, to achieve the most effective possible heat transfer, tightly against the cooler, e.g. by screwing or by compressing by means of suitable additional parts.

FIG. 2 presents one arrangement principle of the internal liquid ducting of a prior-art cooler, to such of which this invention can be applied and such of which has become known e.g. from patent publications U.S. Pat. No. 6,032,726 and U.S. Pat. No. 7,320,359. In it spacious main ducts 22, 23 are bored in the cooler, which ducts are connected via the connectors 12, 13 to an external liquid circulation. Numerous transverse ducts 21, the placement of which is arranged in an appropriate way from the viewpoint of the most efficient possible cooling of the power components, connect the main ducts. For example, in the case of FIGS. 1 and 2, since it is known that the dissipation powers of the power semiconductor modules are considerably greater than those of capacitors, transverse ducts are disposed under the modules in the area A more densely than elsewhere in the cooler.

FIG. 3 presents how a liquid circulation, the flow direction of which is described by the small arrowheads, functions in a cooler according to prior art. The example of the figure describes a situation in which the liquid flow Q1 is low, less than one-half of the rated flow. The external pipe that brings liquid to the cooler is connected to the input connector 12, which is fixed in a sealed manner to the cooler 11. From the connector, the liquid flows into the main duct 22 of the input side, from there onwards into the transverse ducts 21, and finally via the main duct 23 of the output side and via the output connector 13 back into the external circulation. In this example the external pressure P1 of the liquid supply is so small that it produces a rise in the level of the liquid in the cooler only to the level $H_{P1}$, in which case there is sufficient liquid only for the transverse ducts located below this level. Air can remain in the transverse ducts located above the level, in which case the power components disposed at the points of them will be poorly cooled.

FIG. 4 presents an embodiment of the additional part 41 according to the invention. In this case it is manufactured from a round metal tube having a length L, an outer diameter $D_O$ and an inner diameter $D_I$. To minimize the space requirement of the additional part, the wall thickness $(D_O-D_I)/2$ of the pipe is preferably thin, e.g. 1 mm. The bottom end of the additional part, at which it can be fixed to the cooler structure, is marked with the identifier B and, correspondingly, the top end with the identifier T. According to the example, near the bottom end of the additional part, at a distance of $L_P$, are one or more holes P that extend through the wall. What is essential according to the invention is that the combined surface area of the holes is 30%-70%, most preferably 50%, of the inner cross-sectional area (which in the case of the round pipe of the figure is on $\pi * D_I^2/4$) of the additional part. If the additional part is fixed to the cooler structure at elsewhere than at the joint 13, e.g. at the top end of the output duct, the slots N disposed at the bottom end B, or the gap remaining between the additional part and the joint 13, can be used instead of the holes P for implementing the apertures belonging to the first route. If the top end T of the additional part settles tightly against the top end of the output duct, the holes P and the apertures corresponding to the slots N can also be used at the top end of the additional part 41.

FIG. 5A shows how the additional part 41 is placed according to the invention into the output duct 23 of the cooler 11. In this example it is fixed to the liquid connector 13 with some suitable method, e.g. with threads fitted onto these parts or by gluing. The length of the additional part is such that adequate space, e.g. one-half of the diameter of the additional part, remains between the level $H_{41}$ of its top end T and the level $H_{23}$ of the top end of the output duct for ensuring the free inflow of liquid.

According to a preferred embodiment of the invention the center points of the holes P of the additional part that enable the first flow route are located on a level that is closer to the connector 13 than the level $H_1$ of the center point of the first transverse duct $TC_1$. Correspondingly, an advantageous length of the additional part for enabling the second flow route is such that the level $H_{41}$ of the top end T is located farther from the connector 13 than the level $H_N$ of the center point of the topmost transverse duct $TC_N$. The holes P can also be disposed at different levels, e.g. at the points of the lowermost transverse ducts, within the scope of the same inventive concept.

To ensure the free flow of liquid leaving the cooler into the apertures located near the ends of the additional part, the diameter of the output duct 23 is preferably so great that a cross-sectional area remains between the outer surface of the additional part and the inner surface of the output duct that is at least as great as the surface area remaining inside the additional part.

Example of the dimensioning of the ducts and the additional part according to the invention:

Diameter of round output duct 20 mm

Outer diameter of round additional part 15 mm and wall thickness 1 mm

At bottom end of additional part 2 holes, diameter of said holes 6.5 mm

=>From this it follows that the combined surface area of the holes is 66.4 mm$^2$, which is 50% of the inner cross-sectional area 132.7 mm$^2$ of the additional part. A cross-sectional area of 137.4 mm$^2$ remains between the output duct and the additional part, which is 104% of the inner cross-sectional area of the additional part.

FIG. 5B presents one alternative embodiment, wherein the additional part 41 is fixed to the top end of the main duct 23, entry of liquid in the top end of the additional part is arranged with the holes P1 and entry of liquid in the bottom end of the additional part is arranged with a gap P2, which remains between the additional part and the connector 13.

FIG. 6 presents the flow of liquid in a cooler 11 provided with an additional part 41 according to one preferred embodiment of the invention. The partial enlargements 6.1-6.3 situated on the left-hand edge of the figure present in detail how the flow divides in the transverse ducts 21 and in the main duct 23 of the output side. When it is assumed that the combined surface area of the holes P of the additional part is 50% of the inner cross-sectional area of the whole additional part, the flows divide such that the flows of the transverse ducts ($21_4$ and below it) situated closest to the external connectors 12, 13 turn, according to partial FIG. 6.2, downwards to travel via the holes P into the additional part, according to partial FIG. 6.3, and the flows of the transverse ducts situated above the duct $21_4$ into the additional part via the top end T according to the partial FIG. 6.1.

In the descriptive part and in the figures a round shape has been used in the embodiments describing the invention, both in the additional part 41 and in its holes P as well as in the liquid ducts 21-23. Also other cross-sectional shapes, such as square and polygon, are possible.

It is obvious to the person skilled in the art that the different embodiments of the invention are not limited in relation to shape or to any other mechanical aspect solely to the example described above, but that they may be varied within the scope of the claims presented below. Other implementations can also be used for connecting the additional part, in which implementations only a certain part of the total flow can pass via the first flow route of the bottom end, in which case the other part of the flow is forced to travel via the second flow route of the top end. The connectors 12, 13 can be replaced with arrangements machined directly into the cooler as will be well understood by a person skilled in the art.

The invention claimed is:

1. An arrangement for circulating liquid in a liquid cooler for power electronics appliances, inside the cooler at least two longitudinal main ducts being arranged and transverse ducts arranged between the two longitudinal main ducts and connecting the two longitudinal main ducts, and in the cooler one of the longitudinal ducts being an input duct, into which liquid from outside is led via an input joint and the other one the longitudinal ducts being an output duct, from where the liquid is led out via an output joint, wherein a tubular additional part having an open end at least on the side of the output joint is installed inside the output duct, and the additional part is arranged detached from the output duct such that a gap remains between the outer surface of the additional part and the inner surface of the output duct for enabling a liquid flow in the output duct outside the additional part, in the arrangement a first aperture or first apertures are arranged in the part of the additional part on the output joint side between the output joint and a center level of the closest transverse duct to the output joint in the liquid cooler for enabling a first path of passage for a part of the nominal total flow into the additional part and via the additional part onwards to the output joint, wherein the first aperture or first apertures directly face the gap remaining between the outer surface of the additional part and the inner surface of the output duct, a second aperture or second apertures are arranged in the part of the additional part that is farthest from the output joint or between the additional part and the output duct for enabling a second path of passage for the remaining part of the total flow into the additional part and via the additional part onwards to the output joint, the liquid in the output duct is divided to flow through the first path of passage into the additional part and flow through the second path of passage into the additional part, and all of the liquid led out of the output joint comes from the liquid flowing through the first path of passage into the additional part and the liquid flowing through the second path of passage into the additional part, and the additional part is entirely detached from the output duct such that the gap remains between the entire outer surface of the additional part and the entire inner surface of the output duct.

2. The arrangement according to claim 1, wherein the total surface area of the first apertures that are arranged in the part of the additional part on the output joint side and/or in the output joint is 30%-70% of the inner cross-sectional area of the additional part.

3. The arrangement according to claim 1, wherein some of the first apertures of the part on the output joint side, are disposed at a level that is closer to the output joint than to the level of the center point of the closest transverse duct.

4. The arrangement according to claim 1,
wherein
the second path of passage of outgoing liquid situated farther from the output joint into the additional part is implemented such that the additional part is shorter than the output duct, in which case a free liquid flow into it via the aperture of its open top end is possible.

5. The arrangement according to claim 4,
wherein
the length of the additional part is such that at least one-half of the diameter of the additional part is between the level of its top end and the level of the top end of the output duct.

6. The arrangement according to claim 1,
wherein
the additional part is fixed to the top end of the output duct, in which case the second path of passage of outgoing liquid situated farther from the output joint into the additional part is implemented via the apertures or slots disposed in the top end of the additional part.

7. The arrangement according to claim 1,
wherein
the gap between the outer surface of the additional part and the main duct is at least as great as the inner cross-sectional area of the additional part.

8. The arrangement according to claim 1,
wherein
the length of the additional part is such that the level of the end of the additional part that is farther from the output joint, or the level of the center points of the first apertures disposed in the end of the additional part, is located farther from the joint than from the level of the center point of the topmost transverse duct.

9. The arrangement according to claim 2,
wherein
some of the first apertures of the part on the output joint side, are disposed at a level that is closer to the output joint than to the level of the center point of the closest transverse duct.

10. The arrangement according to claim 2,
wherein
the second path of passage of outgoing liquid situated farther from the output joint into the additional part is implemented such that the additional part is shorter than the output duct, in which case a free liquid flow into it via the aperture of its open top end is possible.

11. The arrangement according to claim 3,
wherein
the second path of passage of outgoing liquid situated farther from the output joint into the additional part is implemented such that the additional part is shorter than the output duct, in which case a free liquid flow into it via the aperture of its open top end is possible.

12. The arrangement according to claim 2,
wherein
the additional part is fixed to the top end of the output duct, in which case the second path of passage of outgoing liquid situated farther from the output joint into the additional part is implemented via the apertures or slots disposed in the top end of the additional part.

13. The arrangement according to claim 3,
wherein
the additional part is fixed to the top end of the output duct, in which case the second path of passage of outgoing liquid situated farther from the output joint into the additional part is implemented via the apertures or slots disposed in the top end of the additional part.

14. The arrangement according to claim 2,
wherein
the gap between the outer surface of the additional part and the main duct is at least as great as the inner cross-sectional area of the additional part.

15. The arrangement according to claim 3,
wherein
the gap between the outer surface of the additional part and the main duct is at least as great as the inner cross-sectional area of the additional part.

16. The arrangement according to claim 4,
wherein
the gap between the outer surface of the additional part and the main duct is at least as great as the inner cross-sectional area of the additional part.

17. The arrangement according to claim 5,
wherein
the gap between the outer surface of the additional part and the main duct is at least as great as the inner cross-sectional area of the additional part.

18. The arrangement according to claim 6,
wherein
the gap between the outer surface of the additional part and the main duct is at least as great as the inner cross-sectional area of the additional part.

19. The arrangement according to claim 2,
wherein
the length of the additional part is such that the level of the end of the additional part that is farther from the output joint, or the level of the center points of the first apertures disposed in the end of the additional part, is located farther from the joint than from the level of the center point of the topmost transverse duct.

20. The arrangement according to claim 3,
wherein
the length of the additional part is such that the level of the end of the additional part that is farther from the output joint, or the level of the center points of the first apertures disposed in the end of the additional part, is located farther from the joint than from the level of the center point of the topmost transverse duct.

* * * * *